US009485874B2

(12) United States Patent
Chen et al.

(10) Patent No.: US 9,485,874 B2
(45) Date of Patent: Nov. 1, 2016

(54) PACKAGE SUBSTRATE HAVING PHOTO-SENSITIVE DIELECTRIC LAYER AND METHOD OF FABRICATING THE SAME

(71) Applicants: Industrial Technology Research Institute, Chutung, Hsinchu (TW); Unimicron Technology Corporation, Taoyuan (TW)

(72) Inventors: Yu-Hua Chen, Hsinchu (TW); Wei-Chung Lo, Hsinchu (TW); Dyi-Chung Hu, Taoyuan (TW); Chang-Hong Hsieh, Taoyuan (TW)

(73) Assignees: Industrial Technology Research Institute, Hsinchu (TW); Unimicron Technology Corp., Taoyuan (TW)

( * ) Notice: Subject to any disclaimer, the term of this patent is extended or adjusted under 35 U.S.C. 154(b) by 0 days.

(21) Appl. No.: 14/010,250

(22) Filed: Aug. 26, 2013

(65) Prior Publication Data

US 2014/0102777 A1    Apr. 17, 2014

(30) Foreign Application Priority Data

Oct. 11, 2012  (TW) .............................. 101137406 A

(51) Int. Cl.
*H05K 1/11* (2006.01)
*H05K 3/40* (2006.01)
(Continued)

(52) U.S. Cl.
CPC ........... *H05K 3/4038* (2013.01); *H01L 23/147* (2013.01); *H01L 23/49822* (2013.01); *H01L 23/49827* (2013.01); *H05K 1/115* (2013.01); *H01L 23/49816* (2013.01); *H01L 2224/16225* (2013.01); *H01L 2924/15311* (2013.01); *Y10T 29/49165* (2015.01)

(58) Field of Classification Search
CPC .. H05K 3/4038; H05K 1/115; H01L 23/147; H01L 23/49822; H01L 23/49827
USPC ........................................................ 174/266
See application file for complete search history.

(56) References Cited

U.S. PATENT DOCUMENTS

| 6,097,091 | A  | * | 8/2000  | Ohsumi ........................ 257/758 |
| 7,462,784 | B2 | * | 12/2008 | Kariya et al. ................. 174/260 |
| 2010/0081236 | A1 | * | 4/2010  | Yang .................... H01L 23/147 438/119 |

(Continued)

OTHER PUBLICATIONS

Kumbhat et al., "Low cost, Chip-Last Embedded ICs in Thin Organic Cores", ECTC 2011, pp. 43-47.
(Continued)

*Primary Examiner* — Tremesha S Willis
(74) *Attorney, Agent, or Firm* — Jianq Chyun IP Office

(57) ABSTRACT

A package substrate and a method of fabricating the package substrate are provided. The package substrate may include an interposer having at least one conductive through via, a photo-sensitive dielectric layer formed on one side of the interposer, and at least one conductive via formed in the photo-sensitive dielectric layer and electrically connected to the conductive through via. By means of a photo lithography process with high alignment accuracy, at least one via with an extremely small diameter can be formed on the photo-sensitive dielectric layer and align with the conductive through via. Therefore, the conductive through via can have its diameter reduced as required, without considering the alignment with the at least one via. Accordingly, the interconnection density of the conductive through via on the interposer is increased.

19 Claims, 3 Drawing Sheets

(51) Int. Cl.
*H01L 23/14* (2006.01)
*H01L 23/498* (2006.01)

(56) References Cited

U.S. PATENT DOCUMENTS

| | | | | |
|---|---|---|---|---|
| 2013/0076474 A1* | 3/2013 | Chang | ............... | H01F 17/0013 336/200 |
| 2013/0105213 A1* | 5/2013 | Hu et al. | ............... | 174/266 |
| 2013/0169399 A1* | 7/2013 | Yoo et al. | ............... | 336/180 |
| 2013/0242493 A1* | 9/2013 | Shenoy et al. | ............... | 361/679.21 |

OTHER PUBLICATIONS

Braun et al., "Through Mold Vias for Stacking of Mold Embedded Packages", ECTC 2011, pp. 48-54.
Motohashi et al., "System in wafer-Level Pakage Technology with RDL-first Process", ECTC 2011, pp. 59-64.
Kim et al., "Process and Reliability Assessment of 200m-Thin Embedded Wafer Level Packages", ECTC 2011, pp. 78-83.
Manessis et al., "Chip Embedding technology Developments Leading to the Emergence", ECTC 2010, pp. 803-810.

* cited by examiner

PACKAGE SUBSTRATE HAVING PHOTO-SENSITIVE DIELECTRIC LAYER AND METHOD OF FABRICATING THE SAME

CROSS-REFERENCE TO RELATED APPLICATIONS

This application claims priority to Taiwanese Patent Application No. 101137406, filed on Oct. 11, 2012.

BACKGROUND

1. Technical Field

The present disclosure relates to package substrates, and, relating to a package substrate having an interposer embedded therein and a method of fabricating the package substrate.

2. Description of Related Art

With the growing demands for low-profiled and compact-sized electronic products, a chip has to have a great layout density, and the pitches of contacts on the chip are dramatically reduced accordingly (e.g., a few nanometers). The conductive contacts of a flip-chip package substrate have pitches as great as a few micrometers. Such a package substrate cannot be applied to the modern chips and electronic products.

In order to solve the above-mentioned problems, a silicon interposer is added between the package substrate and the semiconductor chip, metal is electroplated in the silicon interposer to form through-silicon vias (TSV), a redistribution layer (RDL) is then formed on the TSVs, conductive bumps are disposed on one side of the silicon interposer via the end surfaces of the through-silicon vias so as to be electrically connected to the contacts of a package substrate that have greater pitches, and the other side of the silicon interposer is electrically connected to the contacts of a chip that have smaller pitches via conductive pads on a topmost layer of the redistribution layer. In this manner, the package substrate can be electrically connected to a chip that has contacts of a great layout density.

SUMMARY

The present disclosure provides a package substrate, including: an interposer having a first side and a second side opposite to the first side, at least one conductive through via penetrating from the first side to the second side, and a redistribution layer formed on the first side and electrically connected to conductive through via; a photo-sensitive dielectric layer formed on the second side of the interposer; and at least one conductive via formed in the photo-sensitive dielectric layer and electrically connected to the conductive through via.

This disclosure further provides a method of fabricating a package substrate, including: providing an interposer that has a first side and a second side opposite to the first side, at least one conductive through via penetrating from the first side to the second side, and a redistribution layer formed on the first side of the interposer and electrically connected to the conductive through via; forming a photo-sensitive dielectric layer on the second side of the interposer; forming on the photo-sensitive dielectric layer at least one via for the conductive through via to be exposed therefrom; and forming a conductive via in the via electrically connected to the conductive through via.

BRIEF DESCRIPTION OF DRAWINGS

The present disclosure can be more fully understood by reading the following detailed description of the embodiments, with reference made to the accompanying drawings, wherein:

FIG. 2C' is an enlarged view of a portion of FIG. 2C;

FIG. 2F' shows another embodiment different from the embodiment shown in FIG. 2F.

DETAILED DESCRIPTION

Figure 1:
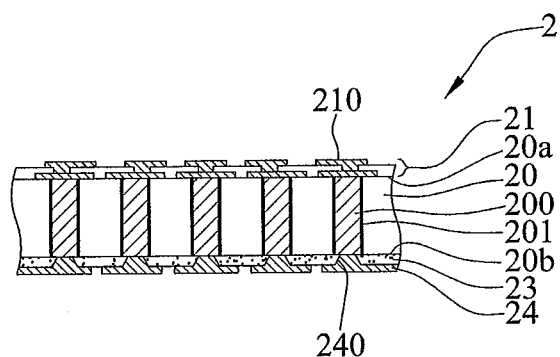
FIGS. 1 and 1' are cross-sectional views of a package substrate of different embodiments according to the present disclosure.
Figure 1:
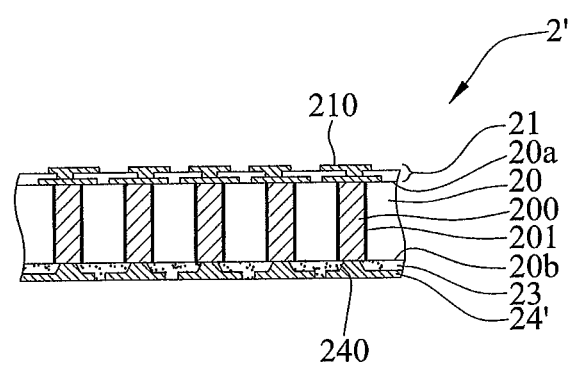

In the following detailed description, for purposes of explanation, numerous specific details are set forth in order to provide a through understanding of the disclosed embodiments. It will be apparent, however, that one or more embodiments may be practiced without these specific details. In other instances, well-known structures and devices are schematically shown in order to simplify the drawing.

It should be noted that the structures, proportions, sizes and the like shown in the attached drawings are to be considered only in conjunction with the contents of this specification to facilitate understanding and reading of those skilled in the art, and are not intended to limit the scope of present disclosure, thus they do not hold any real technically significance, and any changes or modifications in the structures, the proportions, the sizes and the like should fall within the scope of the technical contents disclosed in the present disclosure as long as they do not affect the effects and the objectives achieved by the present disclosure. Meanwhile, terms such as "on", "top", "bottom", "surrounding", "above", "one" or "a" used in this specification are used for ease of illustration only, and not to limit the scope of the present disclosure, any changes or modifications of the relative relationships of elements are therefore to be construed as with the scope of the present disclosure as long as there is no changes to the technical contents.

FIG. 1 is a cross-sectional view of a package substrate 2 of an embodiment according to the present disclosure. The package substrate 2 comprises an interposer 20, a photo-sensitive dielectric layer 23, and a circuit layer 24.

In an embodiment, the interposer 20 contains silicon, and comprises a first side 20a and a second side 20b opposite to the first side 20a, at least one conductive through via 200 penetrating from the first side 20a to the second side 20b, and a redistribution layer 21 formed on the first side 20a and electrically connected to the at least one conductive through via 200. In an embodiment, a plurality of electrode pads 210 are disposed on an outermost surface of the redistribution layer 21, an insulation layer 201 is formed on an outer sidewall of the at least one conductive through via 200, and the at least one conductive through via 200 has an end-surface diameter equal to 20 µm, for example.

In an embodiment, the photo-sensitive dielectric layer 23 is formed on the second side 20b of the interposer 20, and is made of photo-sensitive polyimide (PSPI), benzocyclobutene (BCB) or the like.

The circuit layer 24 is formed on the photo-sensitive dielectric layer 23, as shown in FIG. 1, and has at least one conductive via 240 formed in the photo-sensitive dielectric layer 23 and electrically connected to the at least one conductive through via 200.

In a package substrate 2' in accordance with another embodiment shown in FIG. 1', the circuit layer 24' is embedded in the photo-sensitive dielectric layer 23, in order to reduce the overall height.

Referring to FIGS. 2A to 2F, a method of fabricating a package substrate 2 of an embodiment according to the present disclosure is illustrated.

Figure 2A:
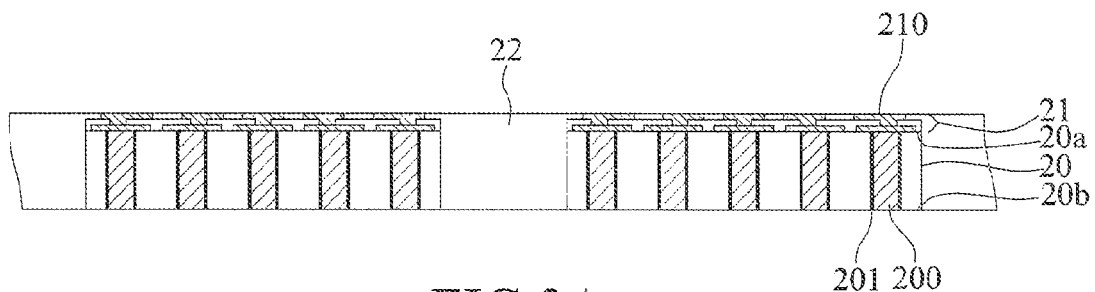
FIGS. 2A to 2F illustrate a method of fabricating a package substrate of an embodiment according to the present disclosure.

As shown in FIG. 2A, a molding layer 22 is formed to encapsulate the interposer 20 such that the interposer 20 is embedded in the molding layer 22, and the redistribution layer 21 is exposed from the molding layer 22.

Figure 2B:
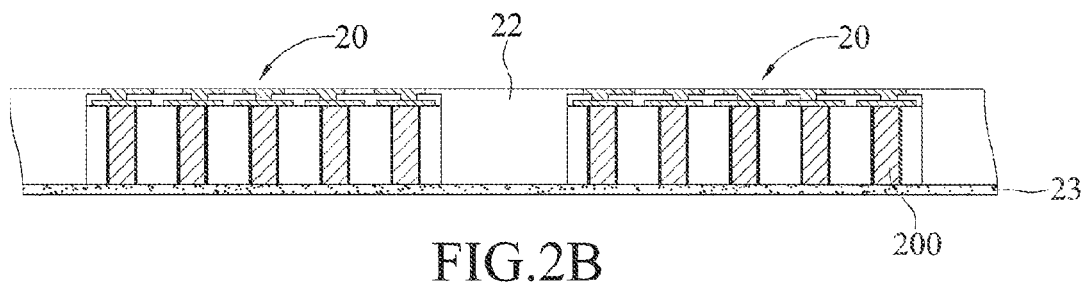

As shown in FIG. 2B, the photo-sensitive dielectric layer 23 is formed on the molding layer 22 and the second side 20b of the interposer 20.

Figure 2C:
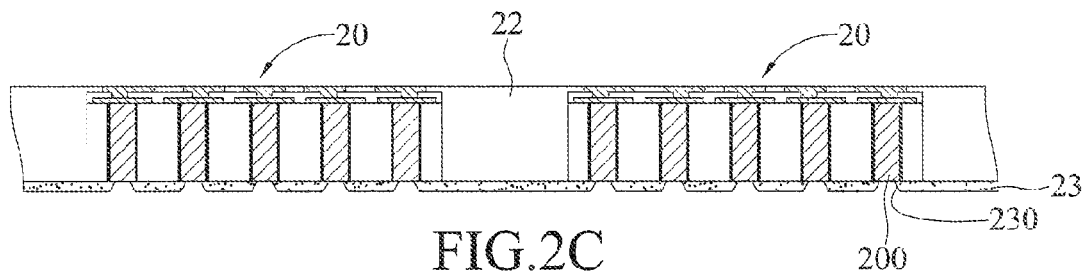
Figure 2C:
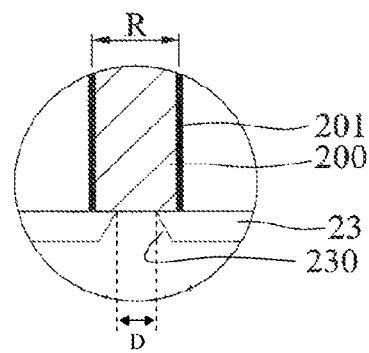

As shown in FIGS. 2C and 2C', a photo lithography process is performed to form in the photo-sensitive dielectric layer 23 at least one via 230 for the conductive through vias 200 to be exposed therefrom.

Figure 2D:
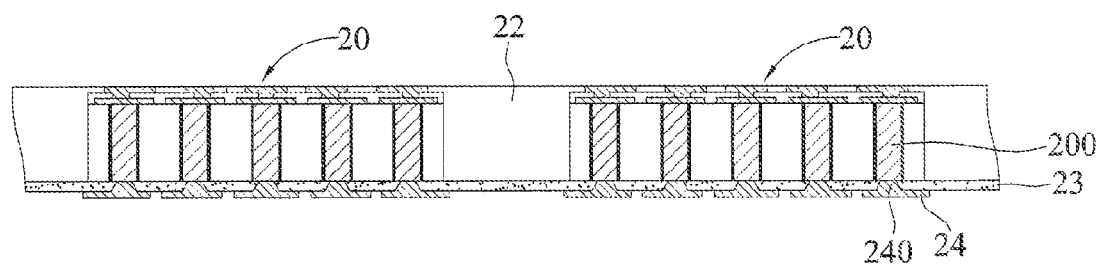

As shown in FIG. 2D, the circuit layer 24 is formed on the photo-sensitive dielectric layer 23, and the at least one conductive via 240 is formed in the at least one via 230 and electrically connected to the at least one conductive through via 200 and the circuit layer 24.

By means of performing the photo lithography process on the photo-sensitive dielectric layer 23, the at least one via 230 can have a diameter D as small as 10 μm, and the alignment accuracy may be maintained less than ±5 μm. Therefore, the location shift of the at least one via 230 is less than 10 μm, and the at least one via 230 can have the alignment accuracy increased. Accordingly, the at least one conductive through via 200 can have a diameter R as small as 20 μm.

The present disclosure can reduce the diameter of the at least one conductive through via 200 on demands. Therefore, the layout density of the at least one conductive through via 200 in the interposer 20 is increased, and the conductive material that is formed in the at least one conductive through via 200 is reduced, and the cost of the material and the electroplating process is reduced. Also, the material stress effect is reduced, the rate of the electroplating process is increased, and the reliability of the products is increased.

Thanks to the remarkable alignment accuracy of the photo lithography process, the at least one via 230 that has an extremely small diameter can be disposed exactly above the end surfaces of the at least one conductive through via 200 that also has an extremely small diameter. Therefore, the at least one conductive via 240 will not come into contact with the silicon material of the interposer 20, and the quality of electrical connection between the at least one conductive via 240 and the at least one conductive through via 200 is significantly improved.

The reduction of the diameter of the at least one via 230 also reduces the area of the photo-sensitive dielectric layer 23 where the end surface of the at least one via 230 occupies. Therefore, the layout area is increased, and the layout density of the circuit layer 24 is also increased.

Figure 2E:
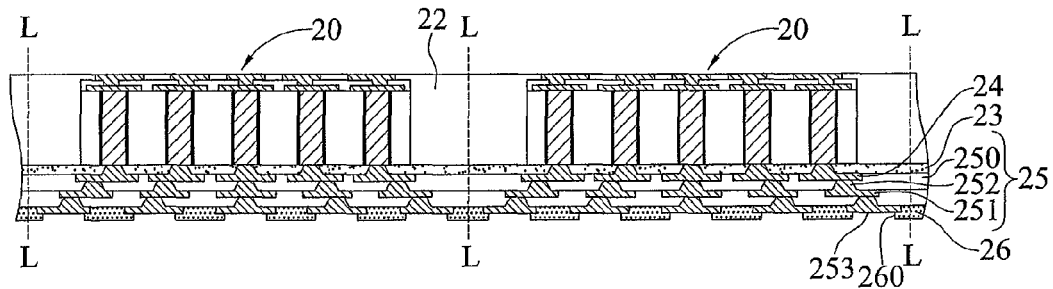

In an embodiment, a circuit built-up structure 25 is fabricated and a cutting process is performed on demands. As shown in FIG. 2E, the circuit built-up structure 25 is disposed on the photo-sensitive dielectric layer 23 and the circuit layer 24, and comprises at lease a dielectric layer 250, another circuit layer 251 formed on the dielectric layer 250, and another conductive vias 252 formed in the dielectric layer 250 and electrically connected to the circuit layers 24 and 251.

An insulating protection layer 26 is then formed on the circuit built-up structure 25, and has a plurality of opening 260 for exposing a portion of the circuit built-up structure 25 that serves as a conductive pad 253.

In general, a laser drilling technique is used to fabricate the vias of the conductive vias 252, and laser alignment marks are also fabricated accordingly. By contrast, when the circuit layer 24, the laser alignment marks and the photo-sensitive dielectric layer 23 can be fabricated at the same time. Therefore, additional process steps are omitted.

Figure 2F:
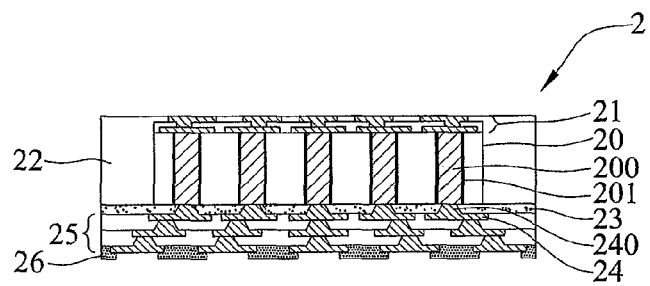
Figure 2F:
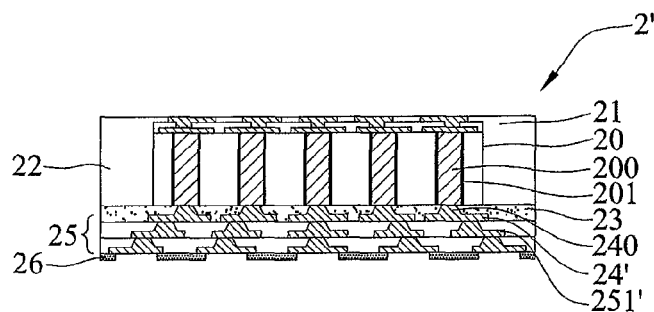

As shown in FIG. 2F, a cutting process is performed along a cutting line L, to form the package substrate 2. In fabricating another package substrate 2', as shown in FIG. 2F', the circuit layer 251' is embedded into the dielectric layer 250 when the circuit built-up structure 25 is fabricated such that the overall height is reduced.

Figure 2G:
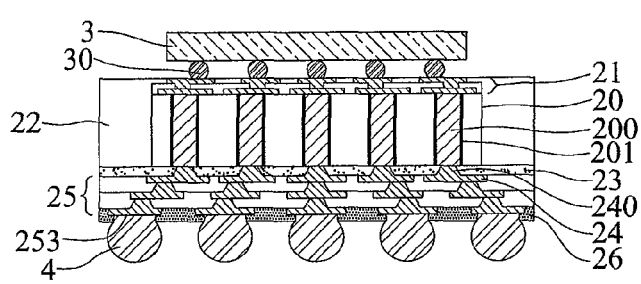
FIG. 2G is a cross-sectional view of a package substrate that is fabricated by the method according to the present disclosure.

In subsequent applications, as shown in FIG. 2G, a semiconductor chip 3 is mounted onto the electrode pads 210 of the redistribution layer 21 conductive bumps or conductive pillars 30, such as solder bumps or Cu pillars, and a solder ball 4 can be disposed on each of the conductive pads. Therefore, the package substrate 2 can be connected to a circuit board (not shown) through the solder balls 4.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A package substrate, comprising:
   an interposer having a first side and a second side opposite to the first side;
   at least one conductive through via penetrating from the first side to the second side;
   a redistribution layer formed on the first side and electrically connected to the conductive through via;
   a photo-sensitive dielectric layer formed on the second side of the interposer;
   a molding layer formed to encapsulate the interposer, wherein a bottom surface of the molding layer is aligned with an end of the conductive through via, and the photo-sensitive dielectric layer directly covers the molding layer and the interposer; and
   at least one conductive via formed in the photo-sensitive dielectric layer and electrically connected to the conductive through via, wherein the conductive via is in direct physical and electrical contact with the conductive through via,
   wherein the photo-sensitive dielectric layer is photo-sensitive polyimide (PSPI).

2. The package substrate of claim 1, wherein the interposer contains silicon.

3. The package substrate of claim 2, wherein the conductive via is free of electrical contact with the silicon of the interposer.

4. The package substrate of claim 1, further comprising an insulation layer formed on a sidewall of the conductive through via, between the conductive through via and a material of the interposer.

5. The package substrate of claim 1, further comprising a circuit layer formed on or in the photo-sensitive dielectric layer and electrically connected to the conductive via.

6. The package substrate of claim 1, further comprising a circuit layer, wherein
the conductive through via has opposite first and second ends, the first end on the first side, and the second end on the second side,
the conductive via has opposite first and second ends, the first end of the conductive via in direct physical and electrical contact with the second end of the conductive through via, and
the circuit layer is in direct physical and electrical contact with the second end of the conductive via, has a width greater than a diameter of the conductive through via.

7. The package substrate of claim 5, further comprising:
a circuit built-up structure disposed on the photo-sensitive dielectric layer and the circuit layer; and
an insulating protection layer formed on the circuit built-up structure and having at least one opening exposing a portion of the circuit built-up structure that defines a conductive pad, wherein the molding layer encapsulates the interposer on at least two opposite lateral sides, and a bottom side of the molding layer is coplanar with the second side of the interposer.

8. The package substrate of claim 7, wherein the photo-sensitive dielectric layer and the circuit built-up structure extend under the bottom side of the molding layer.

9. The package substrate of claim 1, wherein a location shift of the conductive via relative to the conductive through via is less than 10 μm.

10. A method of fabricating a package substrate, comprising:
providing a plurality of interposers, wherein each interposer has
a first side and a second side opposite to the first side,
at least one conductive through via penetrating from the first side to the second side, and
a top redistribution layer formed on the first side of the interposer and electrically connected to a top end of the conductive through via;
molding for encapsulating the plurality of interposers, wherein the molding has a bottom side coplanar with the second side of each interposer;
forming a photo-sensitive dielectric layer on the second side of the plurality of interposers and under the bottom side of the molding;
forming, in the photo-sensitive dielectric layer, at least one via for the conductive through via to be exposed therefrom; and
forming a conductive via in the via for the conductive via to be electrically connected to the conductive through via,
wherein the at least one via is formed in the photo-sensitive dielectric layer by performing a photo lithography process on the photo-sensitive dielectric layer.

11. The method of claim 10, wherein each interposer contains silicon.

12. The method of claim 11, wherein the conductive via is formed to be free of electrical contact with the silicon of each interposer.

13. The method of claim 10, further comprising:
forming an insulation layer on a sidewall of the conductive through via, between the conductive through via and the interposer in which the conductive through via is formed.

14. The method of claim 10, further comprising forming, on or in the photo-sensitive dielectric layer, a circuit layer electrically connected to a bottom end of the conductive via, wherein
the conductive through via has opposite first and second ends, the first end on the first side, and the second end on the second side,
the conductive via has opposite first and second ends, the first end of the conductive via is formed to be in direct physical and electrical contact with the second end of the conductive through via, and
the circuit layer is formed to be in direct physical and electrical contact with the second end of the conductive via.

15. The method of claim 14, further comprising:
forming a circuit built-up structure on a bottom side of the photo-sensitive dielectric layer;
wherein the photo-sensitive dielectric layer and the circuit built-up structure extend under the bottom side of the molding.

16. The method of claim 15, further comprising:
forming on the circuit built-up structure, an insulating protection layer having a plurality of openings for exposing a portion of the circuit built-up structure that defined a conductive pad.

17. The method of claim 10, wherein the photo lithography process is performed on the photo-sensitive dielectric layer so that a location shift of the conductive via relative to the conductive through via is less than 10 μm.

18. The method of claim 10, wherein the photo-sensitive dielectric layer is photo-sensitive polyimide (PSPI).

19. The method of claim 10, further comprising
a cutting process, to cut through a middle of the molding to yield a plurality of individual package units.

\* \* \* \* \*